(12) United States Patent
Azeroual

(10) Patent No.: US 8,803,339 B1
(45) Date of Patent: Aug. 12, 2014

(54) BUMP OUT FOR DIFFERENTIAL SIGNALS

(75) Inventor: Dan Azeroual, Kiriat Ata (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 80 days.

(21) Appl. No.: 13/275,781

(22) Filed: Oct. 18, 2011

Related U.S. Application Data

(60) Provisional application No. 61/405,103, filed on Oct. 20, 2010.

(51) Int. Cl.
*H01L 23/48* (2006.01)
*H01L 23/52* (2006.01)
*H01L 29/40* (2006.01)

(52) U.S. Cl.
USPC ..... 257/786; 257/737; 257/780; 257/E23.021

(58) Field of Classification Search
CPC .......... H01L 23/48916; H01L 23/49838; H01L 23/488; H01L 24/81; H01L 2924/15311; H01L 23/49811; H01L 2224/06153; H01L 2224/14131
USPC .......... 257/737, 738, 883, 786; 439/941; 174/261
See application file for complete search history.

(56) References Cited

U.S. PATENT DOCUMENTS

| | | | |
|---|---|---|---|
| 2005/0230852 A1* | 10/2005 | Lee et al. | 257/787 |
| 2011/0193233 A1* | 8/2011 | Jiang et al. | 257/773 |
| 2012/0001327 A1* | 1/2012 | Zhou et al. | 257/738 |
| 2012/0068339 A1* | 3/2012 | Miller et al. | 257/738 |

OTHER PUBLICATIONS

U.S. Appl. No. 13/275,588, filed Oct. 18, 2011, entitled "Ball-Out for Differential Signals."

* cited by examiner

*Primary Examiner* — Tom Thomas
*Assistant Examiner* — John Bodnar

(57) ABSTRACT

An IC chip includes a matrix of solder bumps aligned in lines of a first axis and lines of a second axis. Adjacent solder bumps aligned in the first axis have a minimum distance and adjacent solder bumps aligned in the second axis have the minimum distance. The matrix includes a first pair of solder bumps aligned in a first line of the first axis and configured to transmit a first pair of differential signals, and a second pair of solder bumps aligned in a second line of the first axis next to the first line and configured to transmit a second pair of differential signals. The second pair of solder bumps are staggered from the first pair of the solder bumps to avoid in alignment with the first pair of solder bumps in the second axis.

7 Claims, 9 Drawing Sheets

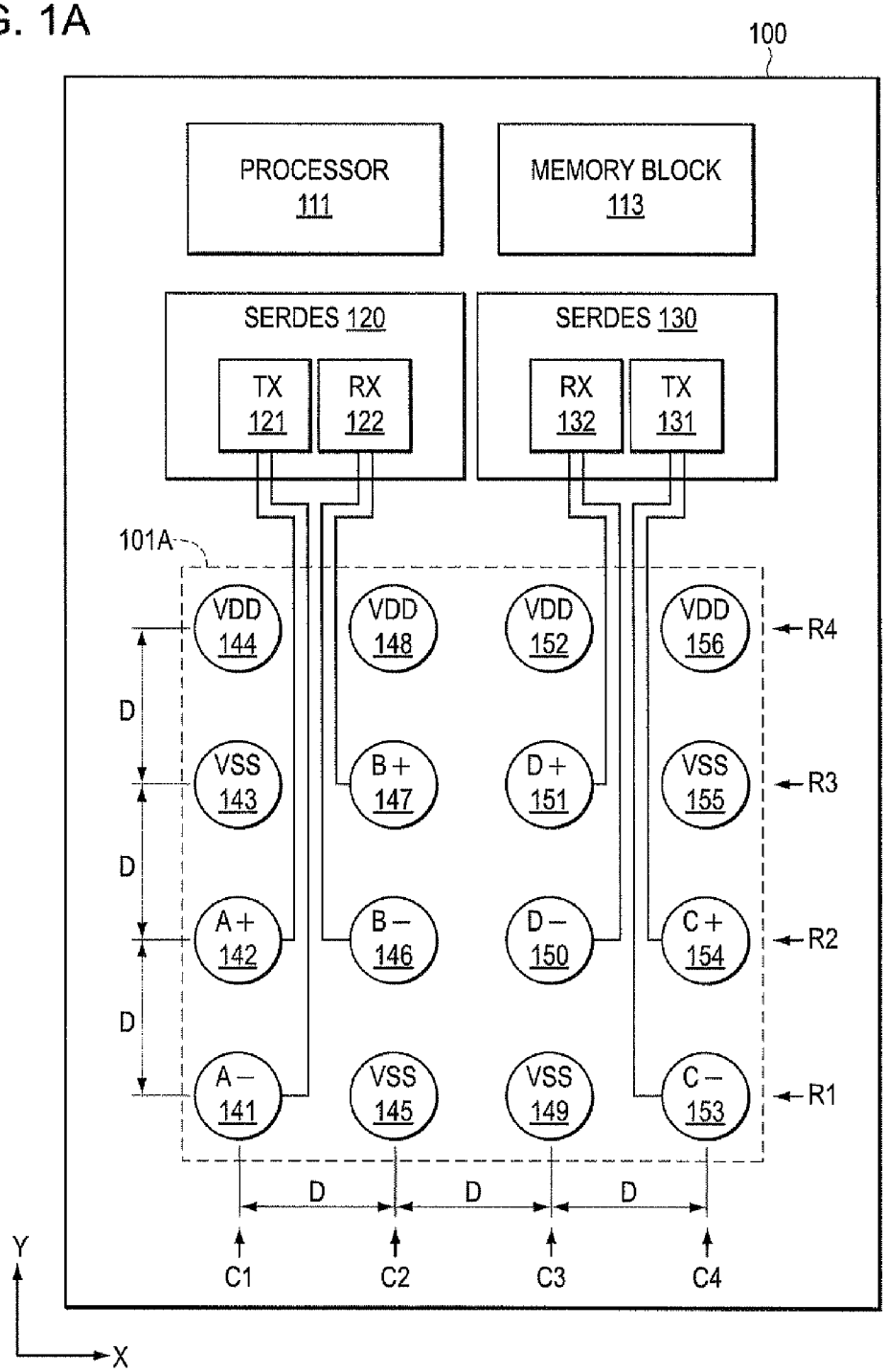

BUMP OUT FOR DIFFERENTIAL SIGNALS

INCORPORATION BY REFERENCE

This application claims the benefit of U.S. Provisional Application No. 61/405,103 "Differential Bump Out Staggered Arrangement for High Speed Serdes" filed on Oct. 20, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, a flip chip uses solder bumps to form electrical connections to couple internal circuits on the flip chip with external circuits out of the flip chip. In an example, a flip chip includes bond pads connected to the internal circuits on the flip chip. Further, solder bumps are deposited on the bond pads. The external circuits are mounted on a printed circuit board (PCB). The PCB includes solder bumps that match the solder bumps on the flip chip. When the solder bumps on the flip chip are aligned with the solder bumps on the PCB, the solder bumps are reflowed to form electrical connections.

SUMMARY

Aspects of the disclosure provide a method for manufacturing an integrated circuit (IC) chip. The method includes forming a first pair of solder bumps on an integrated circuit (IC) chip for transmitting a first pair of differential signals, and forming a second pair of solder bumps on the IC chip for transmitting a second pair of differential signals. The first pair of solder bumps and the second pair of solder bumps are in a matrix of solder bumps aligned in lines of a first axis and lines of a second axis. Adjacent solder bumps aligned in the first axis have a minimum distance and adjacent solder bumps aligned in the second axis have the minimum distance. The first pair of solder bumps are aligned in a first line of the first axis, the second pair of solder bumps are aligned in a second line of the first axis, and the first line and the second line are adjacent. The second pair of solder bumps are staggered from the first pair of the solder bumps to avoid in alignment with the first pair of solder bumps in the second axis, such that distances from at least one of the second pair of solder bumps to the first pair of solder bumps are larger than the minimum distance.

To form the first pair of solder bumps on the IC chip for transmitting the first pair of differential signals, the method includes forming the first pair of solder bumps on the IC chip for transmitting the first pair of differential signals out of the IC chip. To form the second pair of solder bumps on the IC chip for transmitting the second pair of differential signals, the method includes forming the second pair of solder bumps on the IC chip for transmitting the second pair of differential signals into the IC chip.

Further, in an embodiment, the method includes forming connections to couple a transmitting portion of a circuit module, such as a serializer/deserializer (SERDES) on the IC chip, to the first pair of solder bumps, and forming connections to couple a receiving portion of the circuit module to the second pair of solder bumps.

In an embodiment, the method includes forming a third solder bump aligned with the first pair of solder bumps for ground connection.

Further, in an embodiment, the method includes forming a third pair of solder bumps adjacent to the first pair of solder bumps and in alignment with the first pair of solder bumps to transmit a third pair of differential signals in a same direction as the first pair of solder bumps.

Aspects of the disclosure provide a method for integrated circuit design. The method includes assigning a first pair of solder bumps of an integrated circuit (IC) design for transmitting a first pair of differential signals, assigning a second pair of solder bumps for transmitting a second pair of differential signals, and placing and routing circuit modules in the IC design to generate a layout after the solder bump assignments. The first pair of solder bumps and the second pair of solder bumps are in a matrix of solder bumps aligned in lines of a first axis and lines of a second axis. Adjacent solder bumps aligned in the first axis have a minimum distance and adjacent solder bumps aligned in the second axis have the minimum distance, the first pair of solder bumps are aligned in a first line of the first axis, the second pair of solder bumps are aligned in a second line of the first axis, and the first line and the second line are adjacent. The second pair of solder bumps are staggered from the first pair of the solder bumps to avoid in alignment with the first pair of solder bumps in the second axis, such that distances from at least one of the second pair of solder bumps to the first pair of solder bumps are larger than the minimum distance.

To assign the second pair of solder bumps for transmitting the second pair of differential signals, in an example, the method includes assigning the second pair of solder bumps for the second pair of differential signals transmitted in an opposite direction to the first pair of differential signals.

To assign the second pair of solder bumps for transmitting the second pair of differential signals, the method includes assigning the second pair of solder bumps that offset from the first pair of solder bumps by at least the minimum distance in the first axis for transmitting the second pair of differential signals.

To place and route the circuit modules in the IC after the solder bump assignments, the method includes placing a transmitting circuit configured to drive the first pair of differential signals and a receiving circuit configured to receive the second pair of differential signals in the IC design, routing first connections to couple the transmitting circuit to the first pair of solder bumps, and routing second connections to couple the receiving circuit to the second pair of solder bumps based on the solder bump assignments.

According to an embodiment, the method includes assigning a third solder bump aligned with the first solder bumps in the first axis for ground connection. In another embodiment, the method includes assigning solder bumps surrounding the first pair of solder bumps and the second pair of solder bumps for ground connection.

Further, in an embodiment, the method includes assigning a third pair of solder bumps in the closest proximity to the first pair of differential signals for transmitting a third pair of differential signals in a same direction as the first pair of solder bumps before the placement and routing.

Aspects of the disclosure provide an integrated circuit (IC) chip. The IC chip includes a matrix of solder bumps aligned in lines of a first axis and lines of a second axis. Adjacent solder bumps aligned in the first axis have a minimum distance and adjacent solder bumps aligned in the second axis have the minimum distance. The matrix includes a first pair of solder bumps aligned in a first line of the first axis and configured to transmit a first pair of differential signals, and a second pair of solder bumps aligned in a second line of the first axis and configured to transmit a second pair of differential signals. The first line and the second line are adjacent, the second pair of solder bumps are staggered from the first pair of the solder bumps to avoid in alignment with the first pair of solder bumps in the second axis, such that distances from at least one of the second pair of solder bumps to the first pair of solder bumps are larger than the minimum distance.

In an embodiment, the first pair of solder bumps is configured to transmit the first pair of differential signals out of the IC chip, and the second pair of solder bumps is configured to receive the second pair of differential signals coming into the IC chip.

In an embodiment, the IC chip includes a circuit module, such as a serializer/deserializer (SERDES), having a transmitting portion coupled to the first pair of solder bumps to drive the first pair of differential signals and a receiving portion coupled to the second pair of solder bumps to receive the second pair of differential signals.

Further, in an embodiment, the matrix includes a third solder bump aligned with the first pair of solder bumps in the first line. The third solder bump is configured to transmit a first substantially constant voltage, such as ground. In an example, the matrix includes a fourth solder bump aligned with the third solder bump and the first pair of solder bumps in the first line. The fourth solder bump is configured to transmit a second substantially constant voltage.

According to an aspect of the disclosure, the method includes a third pair of solder bumps aligned in a third line of the first axis and configured to transmit a third pair of differential signals in a same direction as the first pair of solder bumps. The third line is adjacent to the first line, and the third pair of solder bumps are in alignment with the first pair of solder bumps in the second axis.

BRIEF DESCRIPTION OF THE DRAWINGS

Various embodiments of this disclosure that are proposed as examples will be described in detail with reference to the following figures, wherein like numerals reference like elements, and wherein:

FIG. 1A shows a schematic diagram of a flip chip 100 with an interface module 101A according to an embodiment of the disclosure;

DETAILED DESCRIPTION OF EMBODIMENTS

Figure 1B:
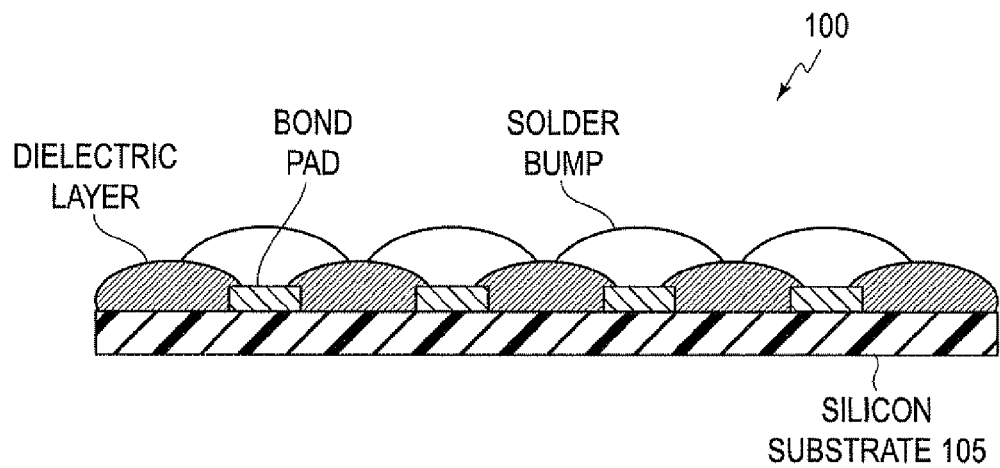
FIG. 1B shows a schematic diagram of a cross-section view of the flip chip 100 according to an embodiment of the disclosure.

FIG. 1A shows a schematic block diagram of a flip chip example 100 according to an embodiment of the disclosure.

The flip chip 100 includes internal circuits, such as a processor 111, a memory block 113, serializer/deserializer (SERDES) 120-130, and the like, built on the flip chip 100 to perform desired functions. Further, the flip chip 100 includes an interface module 101A configured to form connections to connect the internal circuits disposed on the flip chip 100 to external circuits (not shown) that are outside of the flip chip 100.

The flip chip 100 includes circuits for various signal processing. In addition, the flip chip 100 communicates with the external circuits via the interface module 101A. For example, the flip chip 100 transmits signals to the external circuits and receives signals from the external circuits. Various types of signals may be transmitted between the flip chip 100 and the external circuits, such as analog signals, digital signals, and the like. Due to size reduction and circuit integration at various levels of an electronic system, such as at integrated circuit (IC) chip level, IC package level, the electronic system level, and the like, signals may be transmitted by conductive components, such as solder bumps, solder balls, wires, via connections, and the like, located in a relatively close proximity.

It is noted that when a conductive component transmits an electrical signal, an electromagnetic field surrounding the conductive component is created. The electromagnetic field interferes other signals transmitted by other conductive components located in a relatively close proximity to the conductive component, and induces noise in the other signals. The induced noise is referred to as crosstalk. Crosstalk is a function of distance. When two conductive components are located in a relatively close proximity, the crosstalk between two signals transmitted by the two conductive components is relatively larger; and when two conductive components are far away from each other, the crosstalk between two signals transmitted by the two conductive components is relatively small. Large Crosstalk reduces signal to noise ratio, and can cause transmission errors. One way to avoid transmission errors, in an example, is to reduce transmission speed.

According to an embodiment of the disclosure, the flip chip 100 transmits and/or receives a relatively large number of differential signals. The flip chip 100 is configured to reduce the impact of crosstalk among differential signals by suitable arrangement of conductive components, such as solder bump design for the differential signals, and the like. Thus, by reducing crosstalk, the differential signals can be transmitted at a relatively high speed and still maintain relatively large signal to noise ratio.

In an embodiment, the flip chip 100 includes any suitable circuits that generate differential signals, or receive and process differential signals. In the FIG. 1A example, the flip chip 100 includes SERDES that transmits and/or receives differential signals. For example, the flip chip 100 includes a first SERDES 120 and a second SERDES 130 that transmit and/or receive differential signals. The first SERDES 120 includes a transmitting portion TX 121 and a receiving portion RX 122. The TX 121 is configured to generate and transmit a first pair of differential signals A+ and A−, and the RX 122 is configured to receive and process a second pair of differential signals B+ and B−. Similarly, the second SERDES 130 includes a transmitting portion TX 131 and a receiving portion RX 132. The TX 131 is configured to generate transmit a third pair of differential signals C+ and C−, and the RX 132 is configured to receive and process transmit a fourth pair of differential signals D+ and D−. It is noted that, in another example, circuits other than SERDES are contemplated.

According to an embodiment of the disclosure, the interface module 101A includes suitable conductive components to assist signal transmission between the internal circuits on the flip chip 100 and the external circuits. In an example, the interface module 101A includes bond pad-solder bump structures, such as the bond pad-solder bump structures 141-156, formed on the flip chip 100. Each bond pad-solder bump structure includes a solder bump deposited on a bond pad. The bond pads are electrically connected to the internal circuits by wires formed in the flip chip 100, for example. The solder bumps are configured to form electrical connections to the external circuits.

In an example, the external circuits are mounted on a printed circuit board (PCB). In addition, the PCB includes metal lands configured to mount the flip chip 100 on the PCB board. Metal wires are formed on the PCB to electrically connect the metal lands to the external circuits. Further, solder bumps are deposited on the metal lands for mounting the flip chip 100. The solder bumps on the metal lands match the solder bumps on the flip chip 100. After the solder bumps on the flip chip 100 are aligned with the solder bumps on the PCB, the solder bumps are reflowed to form the connections that couple the external circuits on the PCB with the internal circuits on the flip chip 100.

It is noted that, in another example, the flip chip 100 is assembled in a package, such as a ball grid array (BGA) package, and the like. Then, the BGA package is suitably mounted on the PCB board.

FIG. 1B shows a diagram of a cross-section view of the flip chip 100 according to an embodiment of the disclosure. The flip chip 100 includes a substrate, such as a silicon substrate 105. In an embodiment, the internal circuits (not shown) are formed on the silicon substrate 105 using any suitable IC manufacturing process. Then, bond pads are formed on the silicon substrate 105. The bond pads are electrically connected to the internal circuits. Further, various dielectric layers, such as passivation layer, and the like are formed to cover and protect the surface of the flip chip 100. Then, the portion of the dielectric layers on the bond pads are selectively etched away, and the solder bumps are deposited on the bond pads by suitable manufacturing process. It is noted that, in an embodiment, one or more additional metal layer may be formed between a bond pad and a solder bump in order to improve electrical connection between the bond pad and the solder bump.

According to an embodiment of the disclosure, due to the relatively small chip size, and relatively large number of input/output signals, a distance between adjacent bond pad-solder bump structures is relatively small. A signal conducted by a bond pad-solder bump structure may induce relatively large crosstalk to other signals conducted by other bond pad-solder bump structures located in the close proximity to the bond pad-solder bump structure.

According to an embodiment of the disclosure, a relatively large number of input/output signals for the flip chip 100 are differential signals. A pair of differential signals carries information using a difference between the pair of differential signals. The flip chip 100 applies a staggered bond pad-solder bump design for differential signals to spread out the bond pad-solder bumps for differential signals to reduce the crosstalk onto the difference between a pair of differential signals.

In the FIG. 1A example, the bond pad-solder bump structures 141-156 are arranged in a matrix with a minimum center distance of D. The matrix includes four rows R1-R4 of bond pad-solder bump structures, and four columns C1-C4 bond pad-solder bump structures. In each row, the bond pad-solder bump structures are aligned in X-axis; and in each column, the bond pad-solder bump structures are aligned in Y-axis. The center distance between the adjacent rows of the bond pad-solder bump structures is D and the center distance between the adjacent columns of the bond pad-solder bump structures is D.

The first bond pad-solder bump structures 141 and 142 in C1 are electrically connected to the TX 121 to conduct the first pair of differential signals A+ and A−; the second bond pad-solder bump structures 146 and 147 in C2 are electrically connected to the RX 122 to conduct the second pair of differential signals B+ and B−; the fourth bond pad-solder bump structures 150 and 151 in C3 are electrically connected to the RX 132 to conduct the fourth pair of differential signals D+ and D−, and the third bond pad-solder bump structures 153 and 154 in C4 are electrically connected to the TX 131 to conduct the third pair of differential signals C+ and C−.

In an embodiment, according to the staggered bond pad-solder bump design, bond pad-solder bump structures for transmitting two pairs of differential signals are staggered to avoid being located in the closest proximity. Specifically, when two pairs of bond pad-solder bump structures are respectively in two adjacent columns, the two pairs of bond pad-solder bump structures are staggered to avoid the two pairs of bond pad-solder bump structures being aligned in the X-axis. In the FIG. 1A example, the bond pad-solder bump structures 145 and 146 are in the closest proximity to the bond pad-solder bump structures 141 and 142. The bond pad-solder bump structures 146 and 147 are in a staggered arrangement to the bond pad-solder bump structures 141 and 142, such that at least one of the bond pad-solder bump structures, such as the bond pad-solder bump structure 147, has a relatively large distance to the bond pad-solder bump structures 141 and 142. For example, the distances from the bond pad-solder bump structure 147 to both of the bond pad-solder bump structures 141 and 142 are larger than D.

Further, in another embodiment, according to the staggered bond pad-solder bump design, bond pad-solder bump structures for transmitting two pairs of differential signals are staggered such that the two bond pad-solder bump structures for transmitting one pair of differential signals are both closer to the same bond pad-solder bump structure of the other two for transmitting the other differential signals. In the FIG. 1A example, the bond pad-solder bump structures 146 and 147 are both closer to the bond pad-solder bump structure 142 than to the bond pad-solder bump structure 141. Thus, the crosstalk induced by the first pair of differential signals A+ and A− to B+ and the crosstalk induced by the first pair of differential signals A+ and A− to B− have the same polarity. The difference between B+ and B− cancels a portion of the crosstalk.

Further, according to an aspect of the disclosure, backward crosstalk has relatively larger impact on speed limit than forward crosstalk. Forward crosstalk is referred to as crosstalk of two signals transmitted in the same directions, such as two signals transmitted out of the flip chip 100 or two signals received by the flip chip 100; and backward crosstalk is referred to as crosstalk of two signals transmitted in the opposite directions, such as a first signal transmitted out of the flip chip 100 and a second signal transmitted into the flip chip 100. Thus, in an embodiment, the staggered bond pad-solder bump design is used for bond pad-solder bump structures of two pairs of differential signals transmitted in the opposite directions. In the FIG. 1A example, the staggered bond pad-solder bump design is used for the bond pad-solder bump structures of the first differential signals A+ and A− and the second differential signals B+ and B−; and the staggered bond pad-solder bump design is used for the bond pad-solder bump structures of the third differential signals C+ and C− and the fourth differential signals D+ and D−. The staggered bond pad-solder bump design is not applied to the bond pad-solder bump structures of the second differential signals B+ and B− and the fourth differential signals D+ and D−.

Figure 1C:
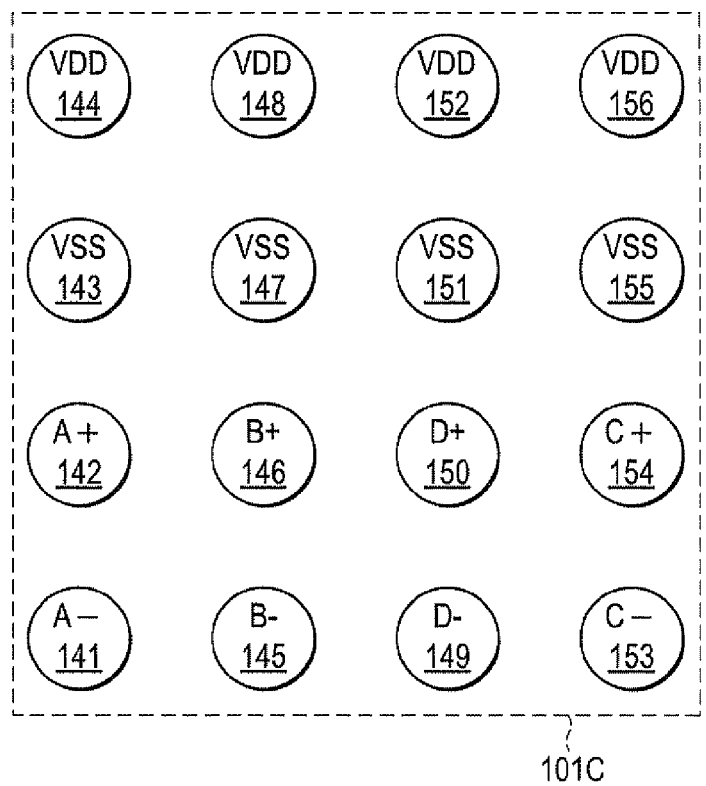
FIG. 1C shows a comparison interface module 101C.

FIG. 1C shows a comparison interface module 101C. The comparison interface module 101C also includes the bond pad-solder bump structures 141-156 for transmitting the four pairs of differential signals. However, the comparison interface module 101C does not apply the staggered bond pad-solder bump design for differential signals. Instead, the comparison interface module 101C uses a regular bond pad-solder bump design that differential signals are transmitted in the closest proximity.

According to an embodiment of disclosure, bond pad-solder bump design and location is determined at a relatively late stage of IC design, for example, after the placement of the internal circuits and the routing for the internal circuits. In an example, the circuit designers who perform placement and routing of the internal circuits assume a regular bond pad-solder bump design, such as the bond pad-solder bump design in FIG. 1C. Later, it is found that the designed circuits fail to operate at a relatively high speed due to relatively high crosstalk between differential signals.

According to an embodiment of the disclosure, the bump designers distribute the respective locations the bond pad-solder bump structures for differential signals to reduce crosstalk onto the difference of the differential signals. In an example, only the bond pad-solder bump structures for two pairs of differential signals transmitted in opposite directions and in the closest proximity need to be staggered, such as the staggered bond pad-solder bump design in FIG. 1A. The staggered bond pad-solder bump design makes relatively small change to the designed circuits.

It is noted that, in an example, the designed circuits need to be rerouted due to the change in the bump design. Due to the relatively small change to the designed circuits, the design effect and design time for rerouting is restively small. In an example, a designer may manually reroute the connections to the bond pad-solder bumps 145-147 and 149-151 after the change of bond pad-solder bumps assignment, for example, from FIG. 1C to FIG. 1A. In another example, a design software is executed by a processor to automatically reroute the connections to the bond pad-solder bumps 145-147 and 149-151 after the change of bond pad-solder bumps assignment, for example, from FIG. 1C to FIG. 1A.

According to another embodiment of the disclosure, the bond pad-solder bump design is determined at a relatively early stage of IC design, for example, before the placement of the internal circuits and the routing for the internal circuits. Then, any suitable bond pad-solder bump design that reduces crosstalk, such as a cross arrangement for differential signals, a staggered arrangement for differential signals, and the like, can be used at the relatively early stage of IC design. Once the crosstalk reducing locations of the bond pad-solder bumps are determined, placement and routing of the internal circuits is designed.

Figure 2A:
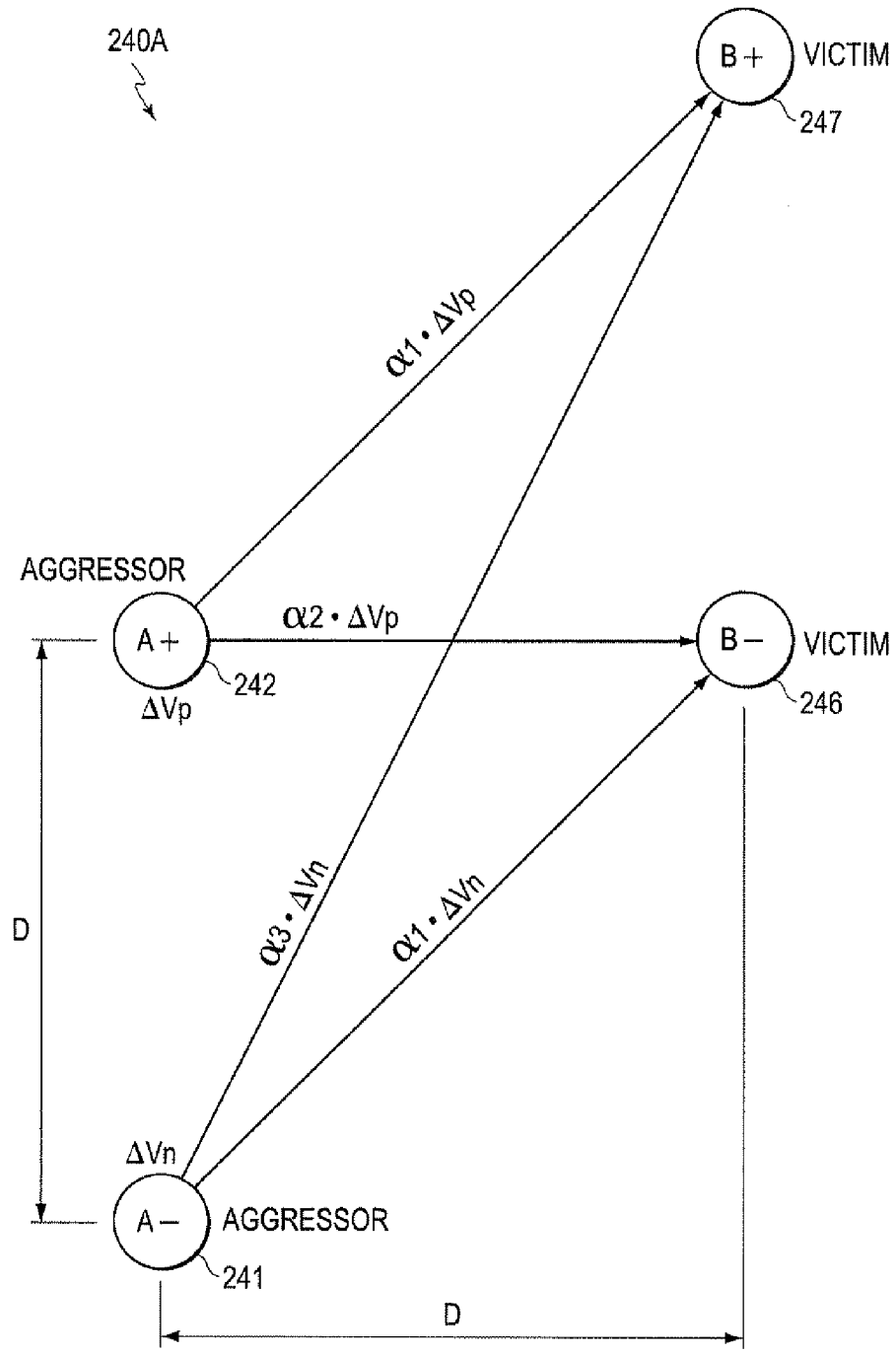
FIG. 2A shows a schematic diagram of a staggered bond pad-solder bump design 240A for transmitting two pairs of differential signals according to an embodiment of the disclosure.

FIG. 2A shows a diagram of a staggered bond pad-solder bump design 240A for two pairs of differential signals according to an embodiment of the disclosure. Staggered bond pad-solder bump design 240A includes four bond pad-solder bump structures 241, 242, 246 and 247. The bond pad-solder bump structures 241 and 242 transmit a first pair of differential signals A+ and A−, and the bond pad-solder bump structures 246 and 247 transmit a second pair of differential signals B+ and B−. In an embodiment, the first pair of differential signals A+ and A−, and the second pair of differential signals B+ and B− are transmitted in opposite directions. For example one pair transmits signals to external circuits, while the other pair receives signals from the external circuits. In another embodiment, the first pair of differential signals A+ and A−, and the second pair of differential signals B+ and B− are transmitted in the same direction.

In the FIG. 2A example, the first pair of differential signals A+ and A− are aggressor signals, and the second pair of differential signals B+ and B− are victim signals. The aggressor signals induce crosstalk to the victim signals. The bond pad-solder bump structures 246 and 247 are offset from the bond pad-solder bump structures 241 and 242 by a distance of D, such that at least one of the victim signals is not in the closest proximity to the aggressor signals. In addition, both the bond pad-solder bump structures 246 and 247 are closer to the bond pad-solder bump structure 242 than the bond pad-solder bump structure 241. Thus, the crosstalk induced by the first pair of differential signals A+ and A− onto B+, and the crosstalk induced by the first pair of differential signals A+ and A− onto B− have the same polarity. Thus, the crosstalk to the second pair of differential signals B+ and B− (the difference of the crosstalk to B+ and the crosstalk to B−) cancels a common portion of the crosstalk nose.

According to an embodiment of the disclosure, crosstalk is a function of distance. When a distance between two conductive components transmitting an aggress signal and a victim signal is relatively small, the crosstalk induced by the aggressor signal to the victim signal is relatively large; and when the distance is relatively large, the crosstalk induced by the aggressor signal to the victim signal is relatively small.

In the FIG. 2A example, when the signal A+ changes a voltage value by $\Delta Vn$, and the signal A− change a voltage value by $\Delta Vp$, crosstalk $X_{B+}$ induced on the signal B+ can be calculated by Eq. 1:

$$X_{B+}=\alpha_1 \times \Delta Vp + \alpha_3 \times \Delta Vn \qquad \text{Eq. 1}$$

and crosstalk $X_{B-}$ induced on the signal B− can be calculated by Eq. 2:

$$X_{B-}=\alpha_2 \times \Delta Vp + \alpha_1 \times \Delta Vn \qquad \text{Eq. 2.}$$

where $\alpha_1$ is a function of the center distance between bond pad-solder bumps 242 and 247, which is the same as the center distance between bond pad-solder bumps 241 and 246, $\alpha_2$ is a function of the center distance between bond pad-solder bumps 242 and 246, and $\alpha_3$ is a function of the center distance between bond pad-solder bumps 241 and 247. Thus, the crosstalk X on the difference of differential signals B+ and B− is calculated by Eq. 3:

$$X=X_{B+}-X_{B-}=(\alpha_1 \times \Delta Vp + \alpha_3 \times \Delta Vn)-(\alpha_2 \times \Delta Vp + \alpha_1 \times \Delta Vn) \qquad \text{Eq. 3}$$

In an example, $\Delta Vn=-\Delta Vp$, $\alpha_1=\frac{1}{2}$, $\alpha_2=1$, and $\alpha_3=\frac{1}{4}$. Then, the crosstalk $X_{B+}$ is equal to $\frac{1}{4}\Delta Vp$, the crosstalk $X_{B-}$ is equal to $\frac{1}{2}\Delta Vp$, the crosstalk X has an absolute value of $|\frac{1}{4}\Delta Vp|$.

Figure 2B:
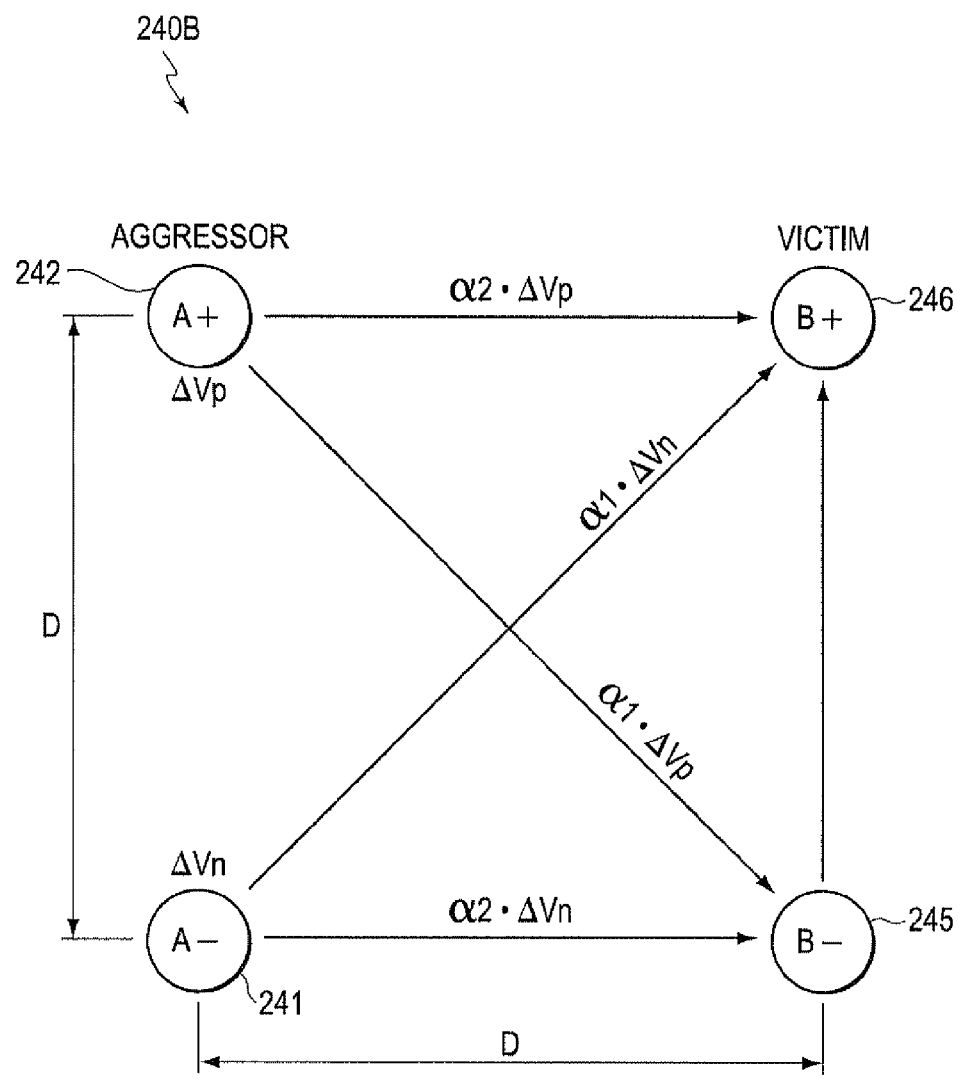
FIG. 2B shows a schematic diagram of a comparison bond pad-solder bump design 240B for transmitting two pairs of differential signals.

FIG. 2B shows a diagram of a comparison bond pad-solder bump design 240B for two pairs of differential signals. The comparison bond pad-solder bump design 240B includes four bond pad-solder bump structures 241, 242, 245 and 246. The bond pad-solder bump structures 241 and 242 of the comparison design transmit a first pair of differential signals A+ and A−, and the bond pad-solder bump structures 245 and 246 transmit a second pair of differential signals B+ and B−.

In the FIG. 2B example, the first pair of differential signals A+ and A− are aggressor signals, and the second pair of differential signals B+ and B− are victim signals. The aggressor signals induce crosstalk to the victim signals. The bond pad-solder bump structures 245 and 246 are in the closest proximity to the bond pad-solder bump structures 241 and 242. For example, the distance between the bond pad-solder bump structures 241 and 242 is the minimum distance D, the distance between the bond pad-solder bump structures 245 and 246 is the minimum distance D, the distance between the bond pad-solder bump structures 245 and 241 is the minimum distance D, and the distance between the bond pad-solder bump structures 246 and 242 is the minimum distance D.

Accordingly, in the FIG. 2B example, when the signal A+ changes a voltage value by $\Delta Vn$, and the signal A− change a voltage value by $\Delta Vp$, crosstalk $X_{B+}$ induced on the signal B+ can be calculated by Eq. 4:

$$X_{B+} = \alpha_2 \times \Delta Vp + \alpha_1 \times \Delta Vn \qquad \text{Eq. 4}$$

and crosstalk $X_{B-}$ induced on the signal B− can be calculated by Eq. 5:

$$X_{B-} = \alpha_2 \times \Delta Vn + \alpha_1 \times \Delta Vp \qquad \text{Eq. 5}$$

Thus, crosstalk X on the differential signals B+ and B− according to the FIG. 2B example is calculated by Eq. 6:

$$X = X_{B+} - X_{B-} = (\alpha_2 \times \Delta Vp + \alpha_1 \times \Delta Vn) - (\alpha_2 \times \Delta Vn + \alpha_1 \times \Delta Vp) \qquad \text{Eq. 6}$$

In an example, $\Delta Vn = -\Delta Vp$, $\alpha_1 = \frac{1}{2}$ and $\alpha_2 = 1$. Then, the crosstalk $X_{B+}$ is equal to $$\frac{1}{2} \Delta Vp,$$

the crosstalk $X_{B-}$ is equal to $$-\frac{1}{2} \Delta Vp,$$

and the crosstalk X has an absolute value of $|\Delta Vp|$.

Comparing the crosstalk value for the staggered bond pad-solder bump design 240A and the comparison bond pad-solder bump design 240B, the staggered bond pad-solder bump design 240A has reduced crosstalk.

Figure 3:
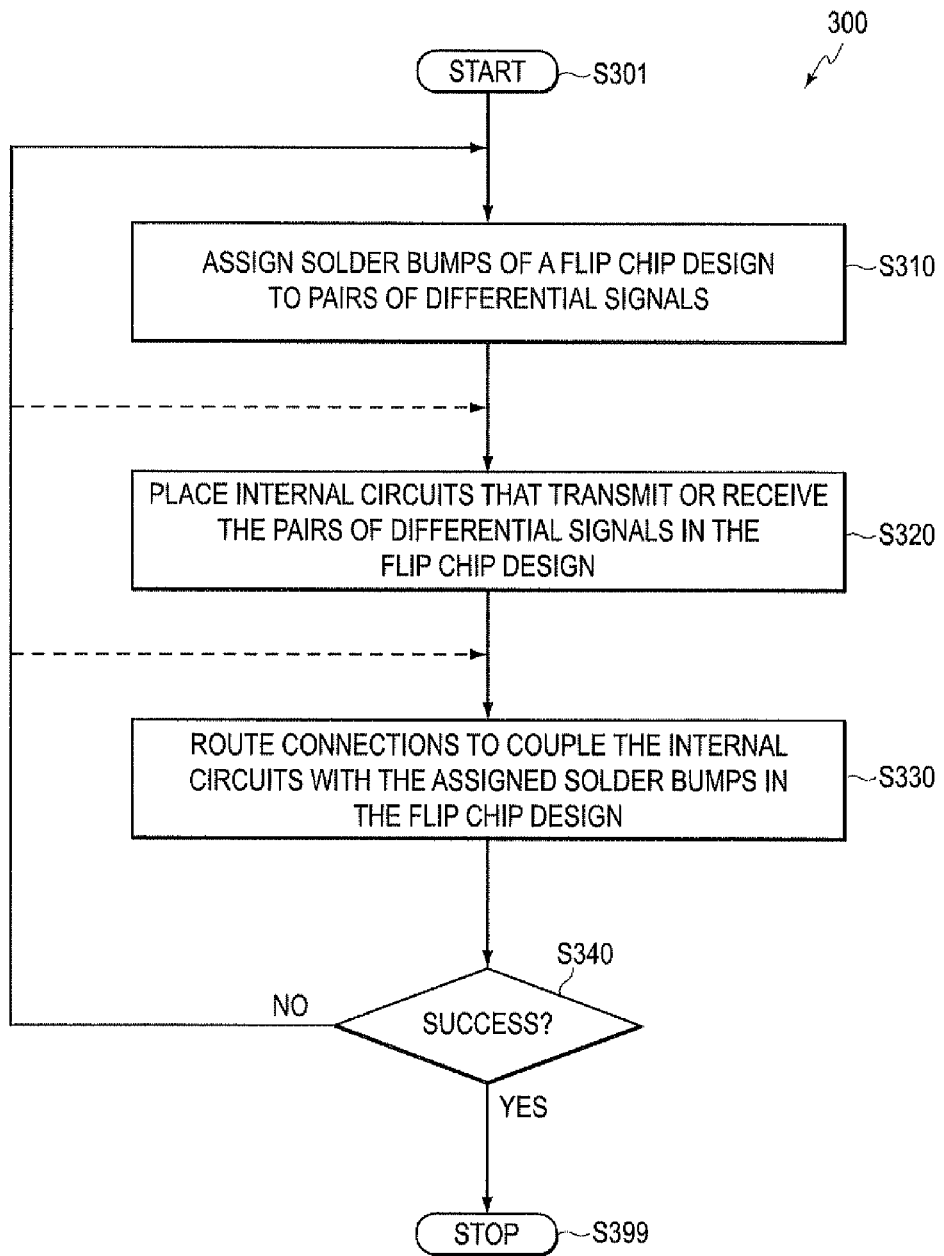
FIG. 3 shows a simplified flow chart outlining an integrated circuit (IC) design process 300 according to an embodiment of the disclosure.

FIG. 3 shows a flow chart outlining a process example 300 for designing a flip chip. The process starts at S301, and proceeds to S310.

At S310, the process step performs bond pad-solder bump design. Specifically, the process step assigns solder bumps of the flip chip design to input and output signals in a manner to reduce crosstalk. In an embodiment, when chip size permits, a relatively large number of solder bumps surrounding the solder bumps assigned for differential signals are assigned for ground connection to maintain symmetrical electromagnetic field. In another embodiment, solder bumps are arranged in a matrix aligned in rows and columns. Adjacent rows have a minimum distance of D and adjacent columns have the minimum distance of D. When solder bumps for two pairs of differential signals are adjacent in two columns, for example, the solder bumps are staggered to avoid the two pairs of solder bumps being aligned in the rows, such that the solder bumps are not in the closest proximity.

At S320, the process step performs placement that places internal circuits, including the circuits that transmit or receive the differential signals, in the flip chip design.

At S330, the process step performs routing that routes connections for the internal circuits and for coupling the internal circuits with the assigned solder bumps in the flip chip design. It is noted that the placement and routing are based on bond pad-solder bump design and do not change the bond pad-solder bump design.

At S340, the process step determines whether the flip chip design is successful. In an example, the process step checks whether the flip chip design satisfies all the design rules. When the flip chip design satisfies all the design rules, the process proceeds to S399 and terminates; otherwise, the process returns to a previous step. In an example, the process returns to S330 to reroute the connections. In another example, the process returns to S320 to generate a different placement for the internal circuits in the flip chip design. In another example, the process returns to S310 to generate a different bond pad-solder bump design for the flip chip design.

Figure 4A:
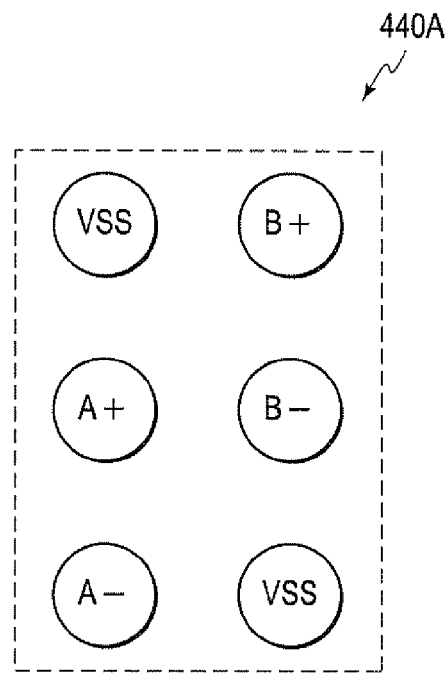
FIGS. 4A-4D show bond pad-solder bump designs 440A-440D for transmitting two pairs of differential signals.

FIG. 4A shows a first bond pad-solder bump design 440A for two pairs of differential signals. The first bond pad-solder bump design 440A includes six bond pad-solder bump structures. Four bond pad-solder bumps structures are assigned for transmitting the two pairs of differential signals and two bond pad-solder bump structures are assigned for ground connection. The four bond pad-solder bumps structures for transmitting the two pairs of differential signals are in the staggered bond pad-solder bump design 240A.

Figure 4B:
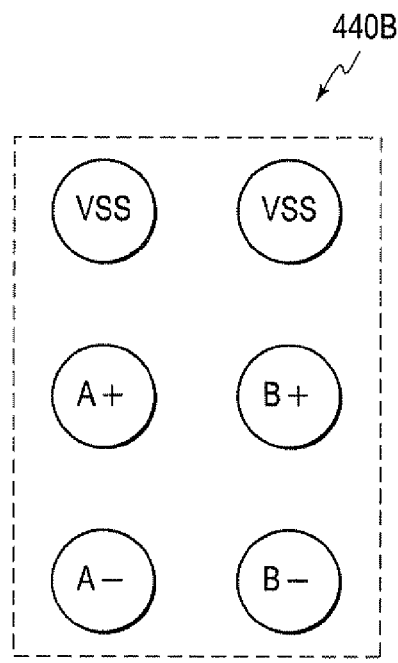

FIG. 4B shows a second bond pad-solder bump design 440B for two pairs of differential signals. The second bond pad-solder bump design 440B includes six bond pad-solder bump structures. Four bond pad-solder bumps structures are assigned for transmitting the two pairs of differential signals and two bond pad-solder bump structures are assigned for ground connection. The four bond pad-solder bumps structures for transmitting the two pairs of differential signals are in the comparison bond pad-solder bump design 240B.

Figure 4C:
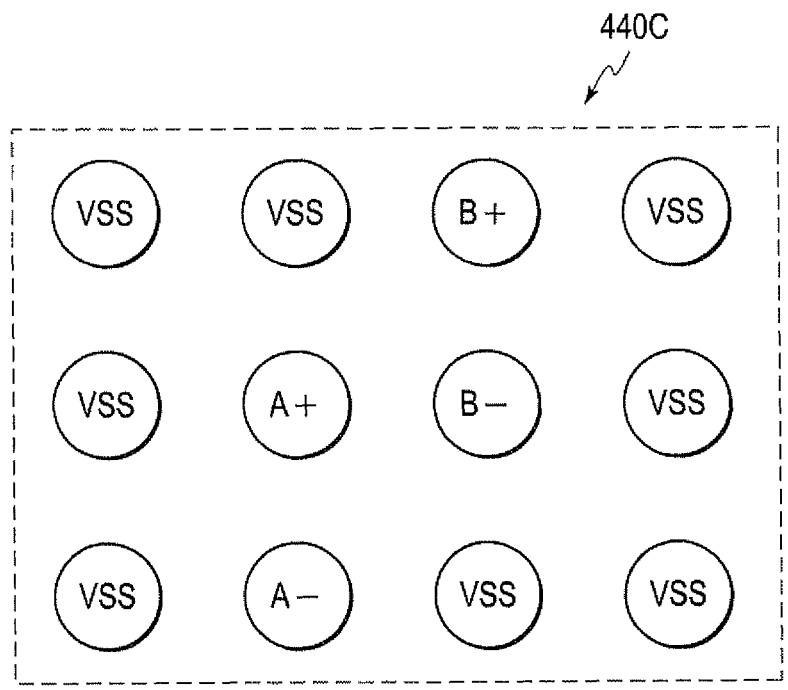

FIG. 4C shows a third bond pad-solder bump design 440C for two pairs of differential signals. The third bond pad-solder bump design 440C includes twelve bond pad-solder bump structures. Four bond pad-solder bumps structures are assigned for transmitting the two pairs of differential signals and eight bond pad-solder bump structures are assigned for ground connection. The four bond pad-solder bumps structures for transmitting the two pairs of differential signals are in the staggered bond pad-solder bump design 240A. The bond pad-solder bump structures assigned for the ground connection surround the four bond pad solder bumps assigned for the differential signals.

Figure 4D:
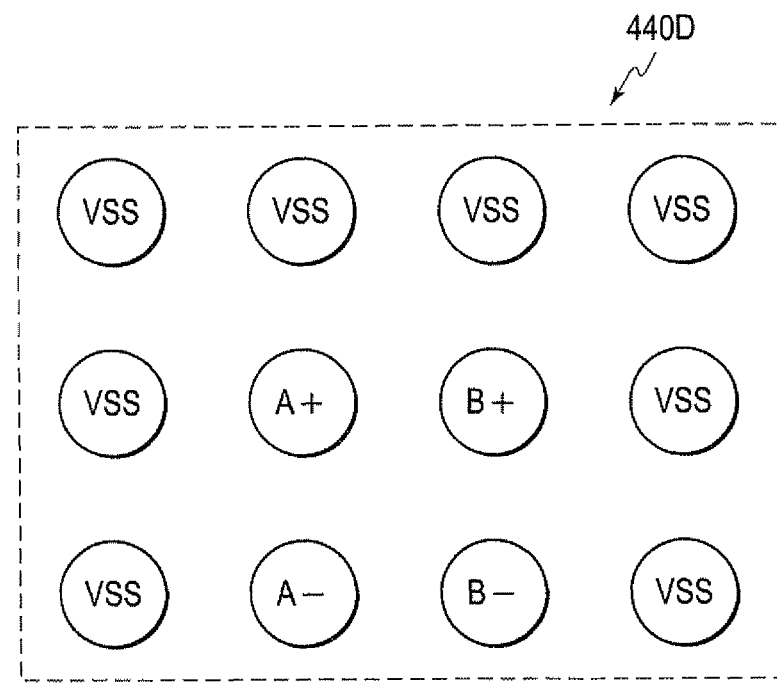

FIG. 4D shows a fourth bond pad-solder bump design 440D for two pairs of differential signals. The fourth bond pad-solder bump design 440D includes twelve bond pad-solder bump structures. Four bond pad-solder bumps structures are assigned for transmitting the two pairs of differential signals and eight bond pad-solder bump structures are assigned for ground connection. The four bond pad-solder bumps structures for transmitting the two pairs of differential signals are in the comparison bond pad-solder bump design 240B. The bond pad-solder bump structures assigned for the ground connection surround the four bond pad solder bumps assigned for the differential signals.

Figure 5:
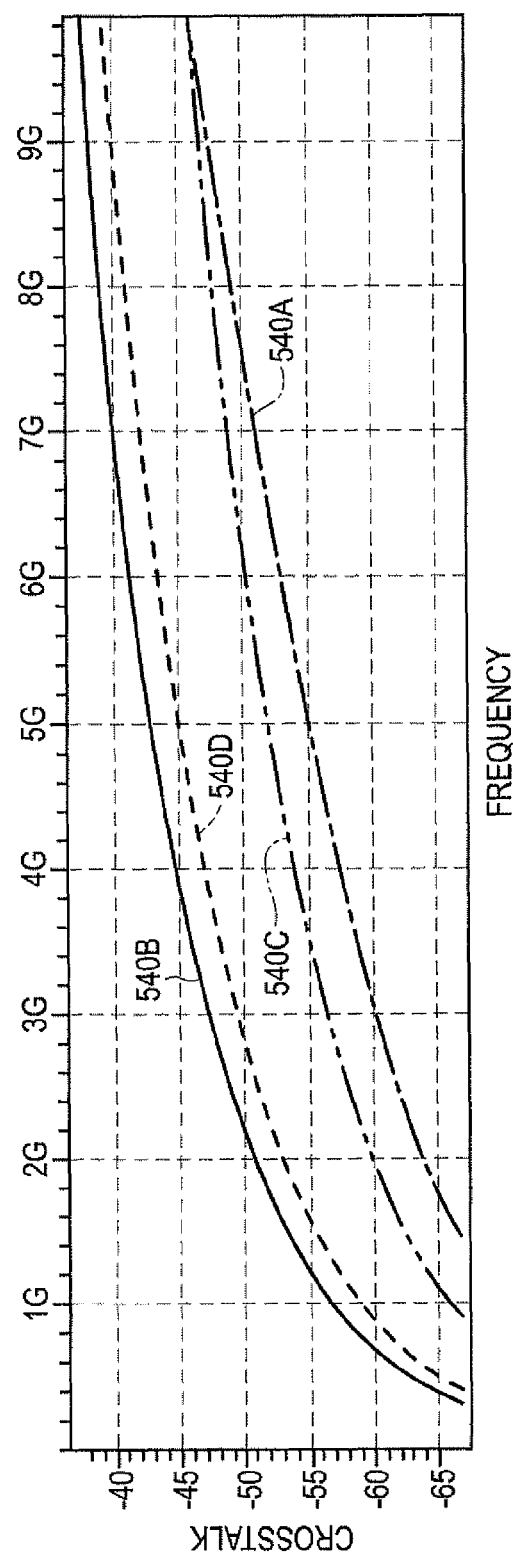
FIG. 5 shows a plot of near-end crosstalk simulation results for the bond pad-solder bump designs 440A-440D.

FIG. 5 shows a plot of near-end crosstalk simulation for the bond pad-solder bump designs 440A-440D. In the near-end crosstalk simulation, the bond pad-solder bumps are connected to one side of cables. The first pair of differential signals A+ and A− are transmitted out of the flip chip via connected cables, and the second pair of differential signals B+ and B− are transmitted into the flip chip via the connected cables. The crosstalk induced by the first pair of differential signals onto the second pair of differential signals at the side of cables connected to the bond pad-solder bumps of the flip chip is simulated and shown in FIG. 5. The X-axis is the transmission frequency of the two pairs of differential signals, and the Y-axis is the value of near-end crosstalk. The plot includes four curves 540A-540D. The first curve 540A shows the simulation for the first bond pad-solder bump design 440A; the second curve 540B shows the simulation for the second bond pad-solder bump design 440B; the third curve 540C shows the simulation for the third bond pad-solder bump design 440C; and the fourth curve 540D shows the simulation for the fourth bond pad-solder bump design 440D.

As can be seen in FIG. 5, the first bond pad-solder bump design 440A has relatively low crosstalk. Thus, when two pairs of differential signals are transmitted in opposite directions, the first bond pad-solder bump design 440A can be used for the two pairs of differential signals to reduce crosstalk.

Figure 6:
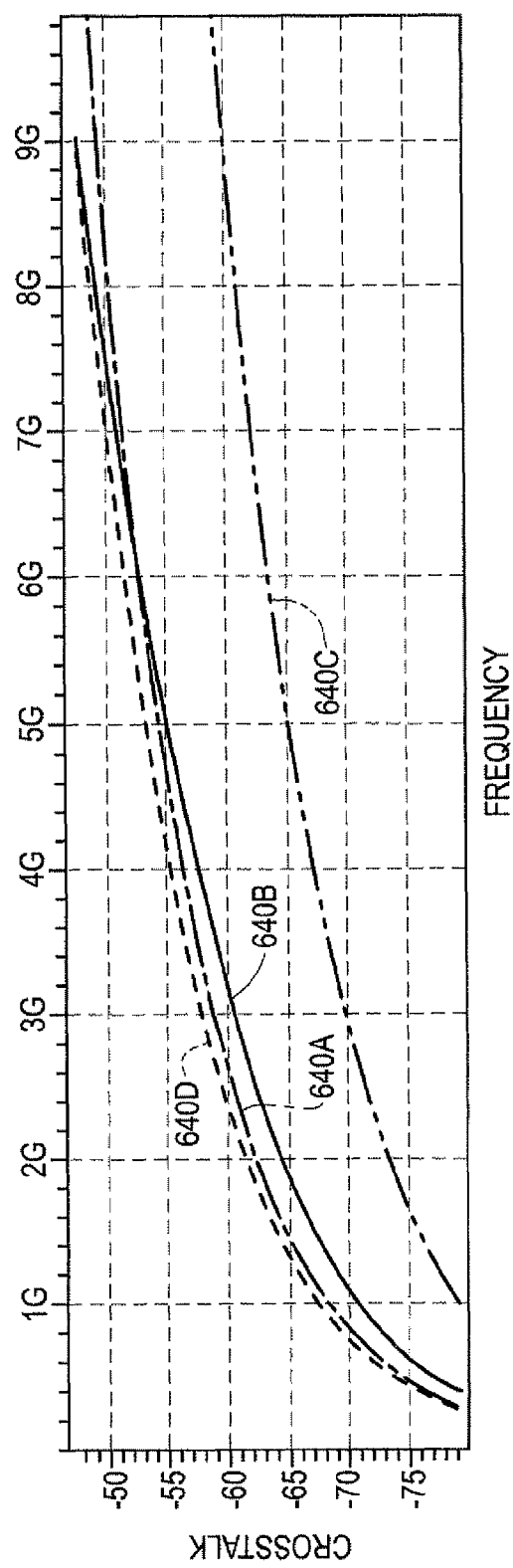
FIG. 6 shows a plot of far-end crosstalk simulation results for the bond pad-solder bump designs 440A-440D.

FIG. 6 shows a plot of far-end crosstalk simulation for the bond pad-solder bump designs 440A-440D. In the far-end crosstalk simulation, the bond pad-solder bumps are connected to one side of cables. The first pair of differential signals A+ and A−, and the second pair of differential signals B+ and B− are transmitted out of the flip chip via the cables. The crosstalk induced by the first pair of differential signals onto the second pair of differential signals at the other side of the cables is simulated and shown in FIG. 6. The X-axis is the transmission frequency of the two pairs of differential signals, and the Y-axis is the value of far-end crosstalk. The plot includes four curves 640A-640D. The first curve 640A shows the simulation for the first bond pad-solder bump design 440A; the second curve 640B shows the simulation for the second bond pad-solder bump design 440B; the third curve 640C shows the simulation for the third bond pad-solder bump design 440C; and the fourth curve 640D shows the simulation for the fourth bond pad-solder bump design 440D.

As can be seen in FIG. 6, the first bond pad-solder bump design 440A, the second bond pad-solder bump design 440B, and the fourth bond pad-solder bump design 440D have very similar far-end crosstalk, and the third bond pad-solder bump design 440C has relatively low far-end crosstalk. Thus, when two pair of differential signals are in the same direction and the flip chip size permits a large number of bond pad-solder bumps for ground connection, the third bond pad-solder bump design 440C can be used for the two pairs of differential signals to reduce far-end crosstalk. However, when the flip chip size does not permit a large number of bond pad-solder bumps for ground connection, the first bond pad-solder bump design 440A or the second bond pad-solder bump design 440B can be used.

While the subject matter of the present disclosure has been described in conjunction with the specific embodiments thereof that are proposed as examples, it is evident that many alternatives, modifications, and variations will be apparent to those skilled in the art. Accordingly, embodiments of the present disclosure as set forth herein are intended to be illustrative, not limiting. There are changes that may be made without departing from the scope of the present disclosure.

What is claimed is:

1. An integrated circuit (IC) chip, comprising:
a matrix of solder bumps aligned in lines of a first axis and lines of a second axis, adjacent solder bumps aligned in the first axis having a minimum distance and adjacent solder bumps aligned in the second axis having the minimum distance, the matrix of solder bumps including:
a first pair of solder bumps aligned in a first line of the first axis and configured to transmit a first pair of differential signals;
a second pair of solder bumps aligned in a second line of the first axis and configured to transmit a second pair of differential signals;
a third pair of solder bumps aligned in a third line of the first axis and configured to transmit a third pair of differential signals in a same direction as the second pair of solder bumps; and
a fourth pair of solder bumps aligned in a fourth line of the first axis and configured to transmit a fourth pair of differential signals in a same direction as the first pair of solder bumps, wherein
the first line and the second line are adjacent, and the second pair of solder bumps are staggered from the first pair of solder bumps to avoid alignment with the first pair of solder bumps in the second axis such that distances from at least one of the second pair of solder bumps to at least one solder bump of the first pair of solder bumps are larger than the minimum distance,
the second line and the third line are adjacent, and the third pair of solder bumps are in alignment with the second pair of solder bumps in the second axis, and
the third line and the fourth line are adjacent, and the fourth pair of solder bumps are staggered from the third pair of solder bumps to avoid alignment with the third pair of solder bumps in the second axis such that distances from at least one of the fourth pair of solder bumps to at least one solder bump of the third pair of solder bumps are larger than the minimum distance.

2. The IC chip of claim 1, wherein
the first pair of solder bumps is configured to transmit the first pair of differential signals out of the IC chip; and
the second pair of solder bumps is configured to receive the second pair of differential signals coming into the IC chip.

3. The IC chip of claim 1, further comprising:
a first serializer/deserializer (SERDES) including a first transmitting portion coupled to the first pair of solder bumps to drive the first pair of differential signals and a first receiving portion coupled to the second pair of solder bumps to receive the second pair of differential signals.

4. The IC chip of claim 1, further comprising:
a fifth solder bump aligned with the first pair of solder bumps in the first line, the fifth solder bump configured to transmit a first substantially constant voltage.

5. The IC chip of claim 4, further comprising:
a sixth solder bump aligned with the fifth solder bump and the first pair of solder bumps in the first line, the sixth solder bump configured to transmit a second substantially constant voltage.

6. The IC chip of claim 4, wherein
the fifth solder bump is configured for ground connection.

7. The IC chip of claim 1, wherein the fourth pair of solder bumps are in alignment with the first pair of solder bumps in the second axis.

* * * * *